United States Patent
Li et al.

(10) Patent No.: US 12,538,580 B2
(45) Date of Patent: Jan. 27, 2026

(54) SEMICONDUCTOR STRUCTURE HAVING DIFFERENT HEIGHTS OF ACTIVE REGIONS

(71) Applicant: TAIWAN SEMICONDUCTOR MANUFACTURING COMPANY LTD., Hsinchu (TW)

(72) Inventors: Jian-Sing Li, Hsinchu (TW); Chi-Yu Lu, New Taipei (TW); Hui-Zhong Zhuang, Kaohsiung (TW); Chih-Liang Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 651 days.

(21) Appl. No.: 16/858,293

(22) Filed: Apr. 24, 2020

(65) Prior Publication Data

US 2021/0134783 A1  May 6, 2021

Related U.S. Application Data

(60) Provisional application No. 62/928,203, filed on Oct. 30, 2019.

(51) Int. Cl.
*H10D 89/10* (2025.01)

(52) U.S. Cl.
CPC .................................... *H10D 89/10* (2025.01)

(58) Field of Classification Search
CPC ............... H01L 27/0207; H01L 23/528; H01L 27/0924; H01L 27/0886; H01L 21/823821; H01L 21/823431; H01L 27/11807; H01L 2027/11875; H01L 2027/11883–11888; H01L 2027/11859; H01L 2027/11862
See application file for complete search history.

(56) References Cited

U.S. PATENT DOCUMENTS

| | | | |
|---|---|---|---|
| 7,888,705 B2 * | 2/2011 | Becker | H01L 23/5226 438/129 |
| 9,209,167 B2 * | 12/2015 | Lu | H01L 22/14 |
| 9,460,259 B2 * | 10/2016 | Baek | H01L 27/0207 |
| 9,767,243 B2 * | 9/2017 | Chiang | H01L 27/0207 |
| 10,236,302 B2 * | 3/2019 | Correale, Jr. | H01L 27/0924 |
| 10,431,686 B1 * | 10/2019 | Yang | H01L 21/823431 |
| 10,497,693 B1 * | 12/2019 | Huang | H01L 27/0924 |
| 10,990,740 B2 * | 4/2021 | Kim | G06F 30/394 |
| 11,855,069 B2 * | 12/2023 | Li | G06F 30/392 |
| 2007/0111405 A1 * | 5/2007 | Watanabe | H01L 27/11807 438/142 |
| 2009/0037864 A1 * | 2/2009 | Becker | H10D 84/903 716/119 |
| 2013/0187237 A1 * | 7/2013 | Yu | H01L 29/161 438/222 |
| 2014/0097493 A1 * | 4/2014 | Baek | H01L 27/0207 257/347 |

(Continued)

*Primary Examiner* — Mohammad M Hoque
(74) *Attorney, Agent, or Firm* — WPAT LAW; Anthony King

(57) ABSTRACT

A semiconductor structure includes a first cell and a second cell. The second cell vertically abuts the first cell. Each first cell has a plurality of first active regions. Each first active region has a first vertical height. Each second cell has a plurality of second active regions. Each second active region has a second vertical height. The second vertical height is different from the first vertical height.

20 Claims, 13 Drawing Sheets

(56) References Cited

U.S. PATENT DOCUMENTS

| | | | |
|---|---|---|---|
| 2016/0055285 A1* | 2/2016 | Baek | H01L 23/528 |
| | | | 716/122 |
| 2017/0033101 A1* | 2/2017 | Sharma | H01L 27/0924 |
| 2017/0053917 A1* | 2/2017 | Azmat | H01L 29/0649 |
| 2017/0194349 A1* | 7/2017 | Chen | H01L 27/092 |
| 2019/0355749 A1* | 11/2019 | Do | H01L 27/11807 |
| 2020/0051977 A1* | 2/2020 | Lim | H01L 27/0924 |

* cited by examiner

SEMICONDUCTOR STRUCTURE HAVING DIFFERENT HEIGHTS OF ACTIVE REGIONS

CROSS-REFERENCE TO RELATED APPLICATION

This application claims the benefit of U.S. Provisional Application No. 62/928,203, filed on Oct. 30, 2019, which is incorporated by reference in its entirety.

BACKGROUND

The semiconductor structure may include numerous circuits electrically coupled together by conductive metal interconnects and lines. The circuits may be derived from standard cells. The standard cell may include transistors or invertors. However, the standard cell may not be used for various applications, and may not get better performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
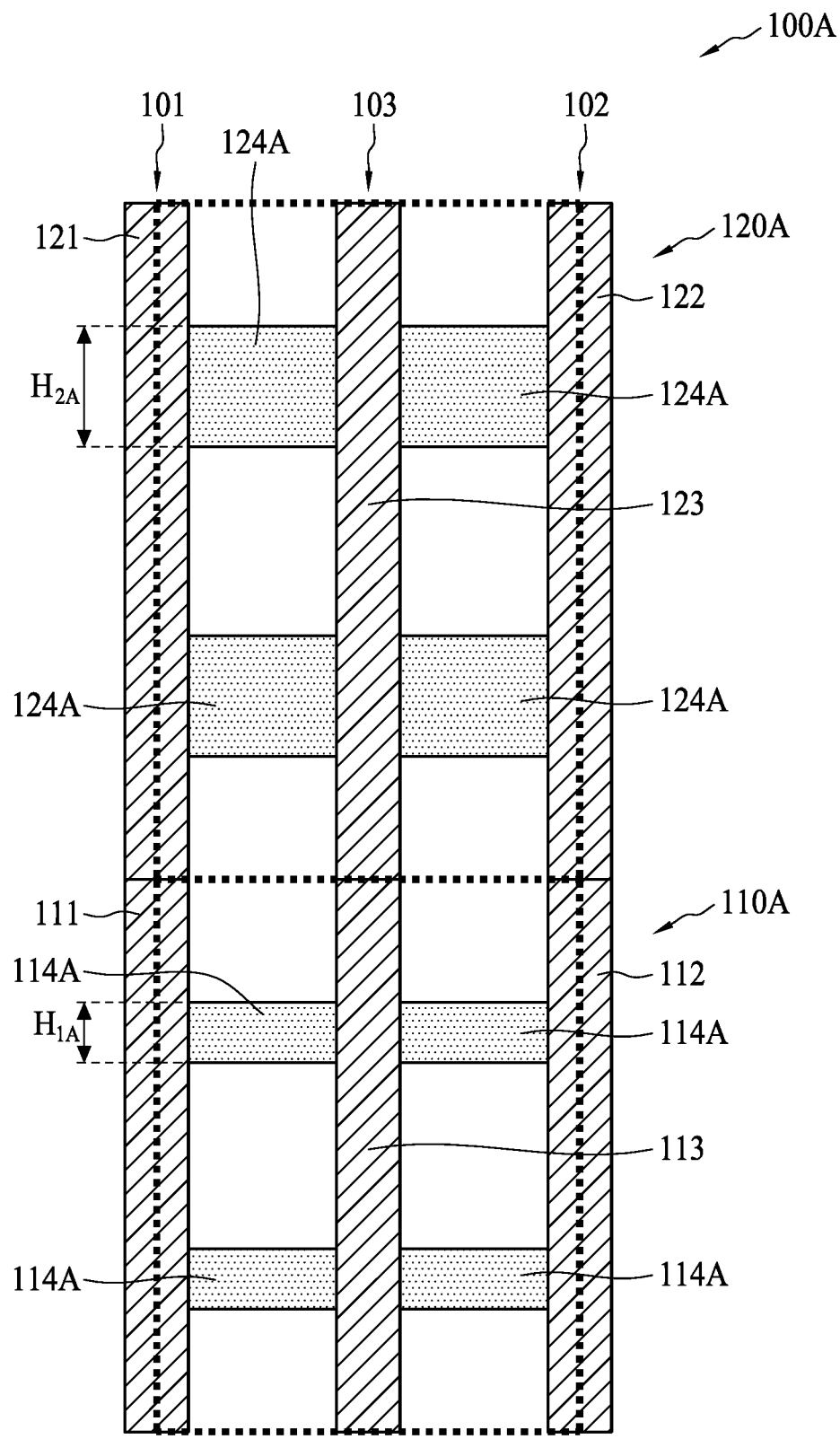
FIG. 1A illustrates a layout view of a semiconductor structure in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to the figures, wherein like numerals indicate like parts throughout the several views. FIG. 1A illustrates a layout view of a semiconductor structure in accordance with some embodiments of the present disclosure. Referring to FIG. 1A, a semiconductor structure 100A may include a first cell 110A and a second cell 120A. The second cell 120A vertically abuts the first cell 110A. The first cell 110A includes a first boundary polysilicon section 111, a second boundary polysilicon section 112, a first gate polysilicon section 113 and a plurality of first active regions 114A. The first gate polysilicon section 113 is disposed between the first boundary polysilicon section 111 and the second boundary polysilicon section 112, and the first gate polysilicon section 113 is separated from the first boundary polysilicon section 111 and the second boundary polysilicon section 112. In some embodiments, the first boundary polysilicon section 111 may be a source terminal, and the second boundary polysilicon section 112 may be a drain terminal; or the first boundary polysilicon section 111 may be a drain terminal, and the second boundary polysilicon section 112 may be a source terminal.

The first active regions 114A are disposed between the first boundary polysilicon section 111 and the first gate polysilicon section 113, and are connected to the first boundary polysilicon section 111 and the first gate polysilicon section 113. In accordance with some embodiments of the present disclosure, there are two first active regions 114A are disposed between the first boundary polysilicon section 111 and the first gate polysilicon section 113. And, the first active regions 114A are disposed between the second boundary polysilicon section 112 and the first gate polysilicon section 113, and are connected to the second boundary polysilicon section 112 and the first gate polysilicon section. In accordance with some embodiments of the present disclosure, there are two first active regions 114A are disposed between the second boundary polysilicon section 112 and the first gate polysilicon section 113. Each first active region 114A has a first vertical height $H_{1A}$. The first vertical height $H_{1A}$ is determined based on a distance along with a longitudinal direction of the first gate polysilicon section 113. The first vertical height $H_{1A}$ of the first active regions 114A may determine the current between the first gate polysilicon section 113 and the first boundary polysilicon section 111/or the second boundary polysilicon section 112.

The second cell 120A includes a third boundary polysilicon section 121, a fourth boundary polysilicon section 122, a second gate polysilicon section 123 and a plurality of second active regions 124A. The second gate polysilicon section 123 is disposed between the third boundary polysilicon section 121 and the fourth boundary polysilicon section 122, and the second gate polysilicon section 123 is separated from the third boundary polysilicon section 121 and the fourth boundary polysilicon section 122.

The second active regions 124A are disposed between the third boundary polysilicon section 121 and the second gate polysilicon section 123, and are connected to the third boundary polysilicon section 121 and the second gate polysilicon section 123. In accordance with some embodiments of the present disclosure, there are two second active regions 124A are disposed between the third boundary polysilicon section 121 and the second gate polysilicon section 123. And, the second active regions 124A are disposed between the fourth boundary polysilicon section 122 and the second gate polysilicon section 123, and are connected to the fourth boundary polysilicon section 122 and the second gate polysilicon section 123. In accordance with some embodiments of the present disclosure, there are two second active regions 124A are disposed between the fourth boundary polysilicon section 122 and the second gate polysilicon section 123. In some embodiments, the first active region and the second active region may be the oxidation diffusion region. Each second active region 124A has a second vertical height $H_{2A}$. The second vertical height $H_{2A}$ is determined based on a distance along with a longitudinal direction of the second gate polysilicon section 123. The second vertical height $H_{2A}$ of the second active regions 124A may determine the current between the second gate polysilicon section 123 and the third boundary polysilicon section 121/or the fourth boundary polysilicon section 122.

In accordance with some embodiments of the present disclosure, the second vertical height $H_{2A}$ is different from the first vertical height $H_{1A}$. The first vertical height $H_{1A}$, is a multiple of fin number, and the second vertical height $H_{2A}$ is a multiple of fin number. For example, the first vertical height $H_{1A}$ is one fin number, and the second vertical height $H_{2A}$ is two fin numbers. Since the first cell 110A with the first vertical height $H_{1A}$ and the second cell 120A with the second vertical height $H_{2A}$ are combined in the semiconductor structure 100A, the low power design for the first cell 110A and the high power design for the second cell 120A may be obtained in the same semiconductor structure 100A so as to get more flexibility design in chip-level.

In some embodiments, the semiconductor structure 100A may include a third cell (not shown in the drawings) vertically abuts the first cell 110A or the second cell 120A. The third cell has the same structure as the first cell 110A and the second cell 120A. The third active region of the third cell has a third vertical height, and the third vertical height is different from the first vertical height $H_{1A}$ and the second vertical height $H_{2A}$.

In accordance with some embodiments of the present disclosure, the first boundary polysilicon section 111 is connected to the third boundary polysilicon section 121 to form a first boundary polysilicon segment 101. The second boundary polysilicon section 112 is connected to the fourth boundary polysilicon section 122 to form a second boundary polysilicon segment 102. The first gate polysilicon section 113 is connected to the second gate polysilicon section 123 to form a first gate polysilicon segment 103.

In accordance with some embodiments of the present disclosure, the first cell 110A and the second cell 120A are formed as a cell group. The semiconductor structure 100A may include a plurality of cell groups. The cell group includes a first boundary polysilicon segment 101, a second boundary polysilicon segment 102, a gate polysilicon segment 103, a plurality of first active regions 114A and a plurality of second active regions 124A. The gate polysilicon segment 103 is disposed between the first boundary polysilicon segment 101 and the second boundary polysilicon segment 102, and the gate polysilicon segment 103 is separated from the first boundary polysilicon segment 101 and the second boundary polysilicon segment 102.

The first active regions 114A are disposed in the first cell 110A, and are disposed between the first boundary polysilicon segment 101 and the gate polysilicon segment 103, and connected to the first boundary polysilicon segment 101 and the gate polysilicon segment 103. In addition, the first active regions 114A are disposed between the second boundary polysilicon segment 102 and the gate polysilicon segment 103, and are connected to the second boundary polysilicon segment 102 and the gate polysilicon segment 103.

The second active regions 124A are disposed in the second cells 120A, and are disposed between the first boundary polysilicon segment 101 and the gate polysilicon segment 103, and are connected to the first boundary polysilicon segment 101 and the gate polysilicon segment 103. And, the second active regions 124A are disposed between the second boundary polysilicon segment 102 and the gate polysilicon segment 103, and are connected to the second boundary polysilicon segment 102 and the gate polysilicon segment 103.

In some embodiments, the cell group has the first cell 110A with the first vertical height $H_{1A}$, and the second cell 120A with the second vertical height $H_{2A}$, the low power design for the first cell 110A and the high power design for the second cell 120A may be obtained in the same cell group 100A so as to get more flexibility design in chip-level.

Figure 7:
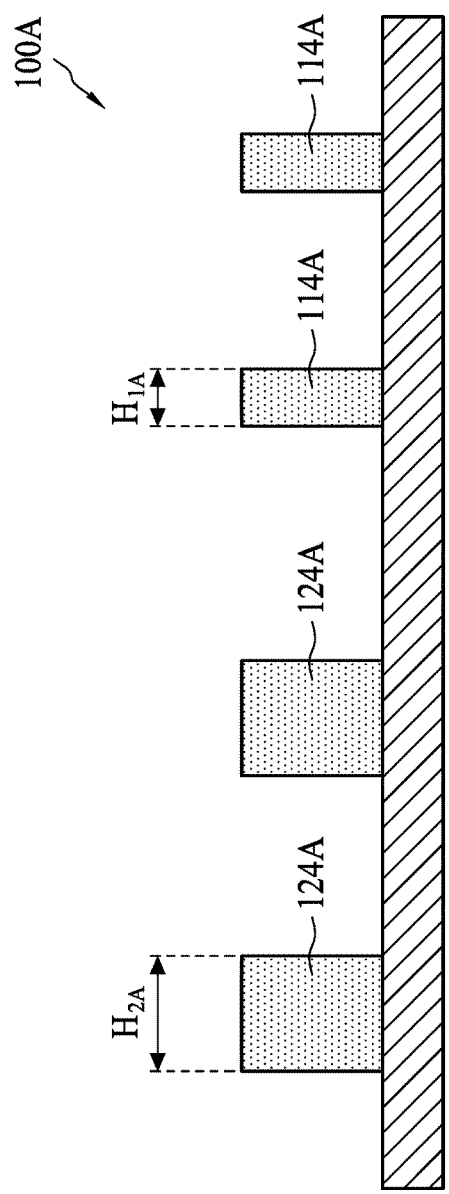
FIG. 7 illustrates a cross sectional view of a semiconductor structure in accordance with some embodiments of the present disclosure.

FIG. 7 illustrates a cross sectional view of a semiconductor structure in accordance with some embodiments of the present disclosure. Referring to FIGS. 1A and 7, The first vertical height $H_{1A}$ of the first active region 114A shows a width determining the current between the first gate polysilicon section 113 and the first boundary polysilicon section 111/or the second boundary polysilicon section 112. The second vertical height of the second active region 124A shows a width determining the current between the second gate polysilicon section 123 and the third boundary polysilicon section 121/or the fourth boundary polysilicon section 122.

Figure 1B:
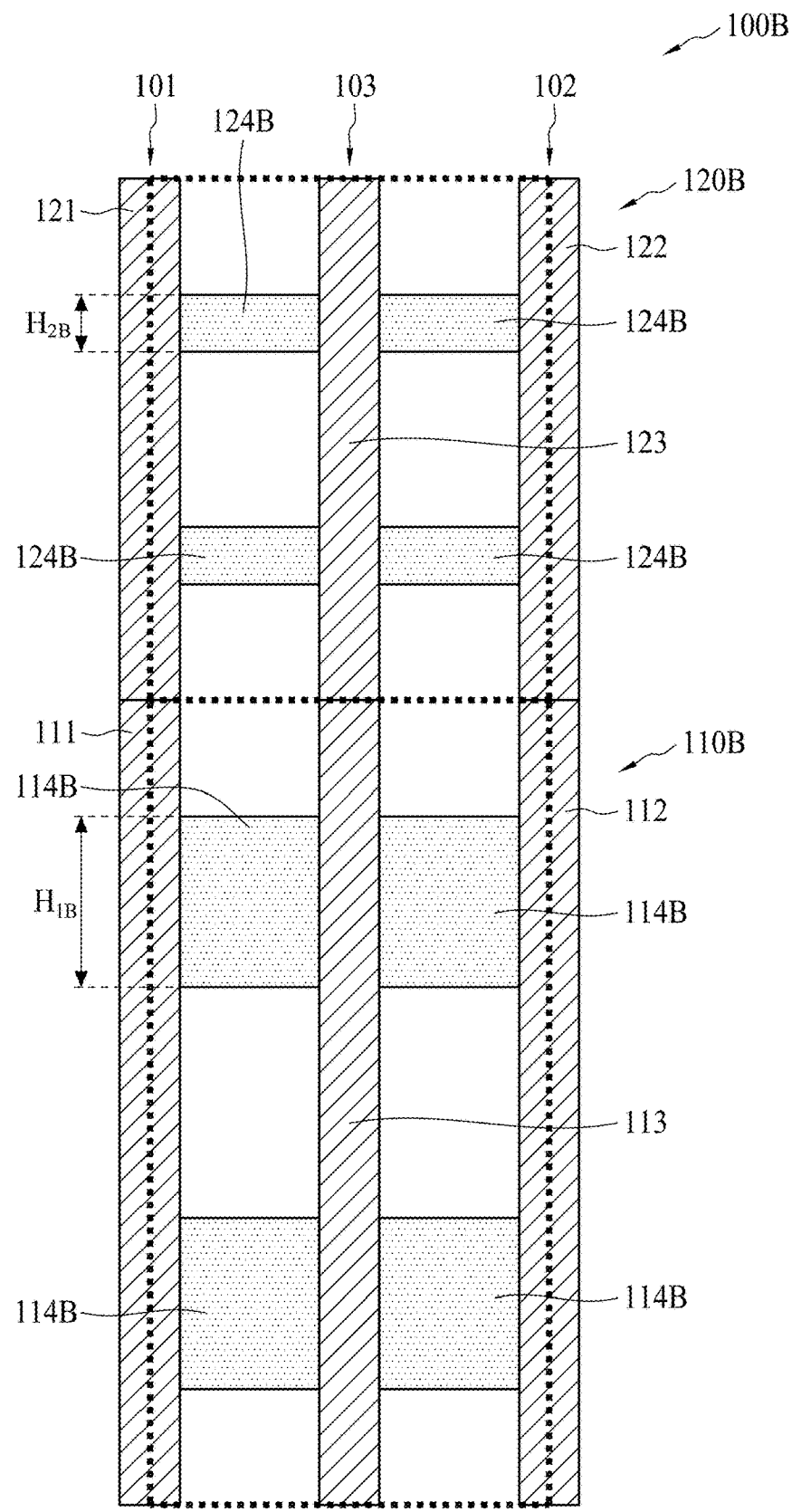
FIG. 1B illustrates a layout view of a semiconductor structure in accordance with another embodiments of the present disclosure.

FIG. 1B illustrates a layout view of a semiconductor structure in accordance with another embodiments of the present disclosure. Referring to FIG. 1B, a semiconductor structure 100B may include a first cell 110B and a second cell 120B. The second cell 120B vertically abuts the first cell 110B. Each first active region 114B has a first vertical height $H_{2B}$, and each second active region 124B has a second vertical height $H_{1B}$. The second vertical height $H_{2B}$ is different from the first vertical height $H_{1B}$. In accordance with some embodiments of the present disclosure, the first vertical height $H_{1B}$ is a multiple of fin number, and the second vertical height $H_{2B}$ is a multiple of fin number. For example, the first vertical height $H_{1B}$ is three fin numbers, and the second vertical height $H_{2B}$ is one fin numbers.

Figure 1C:
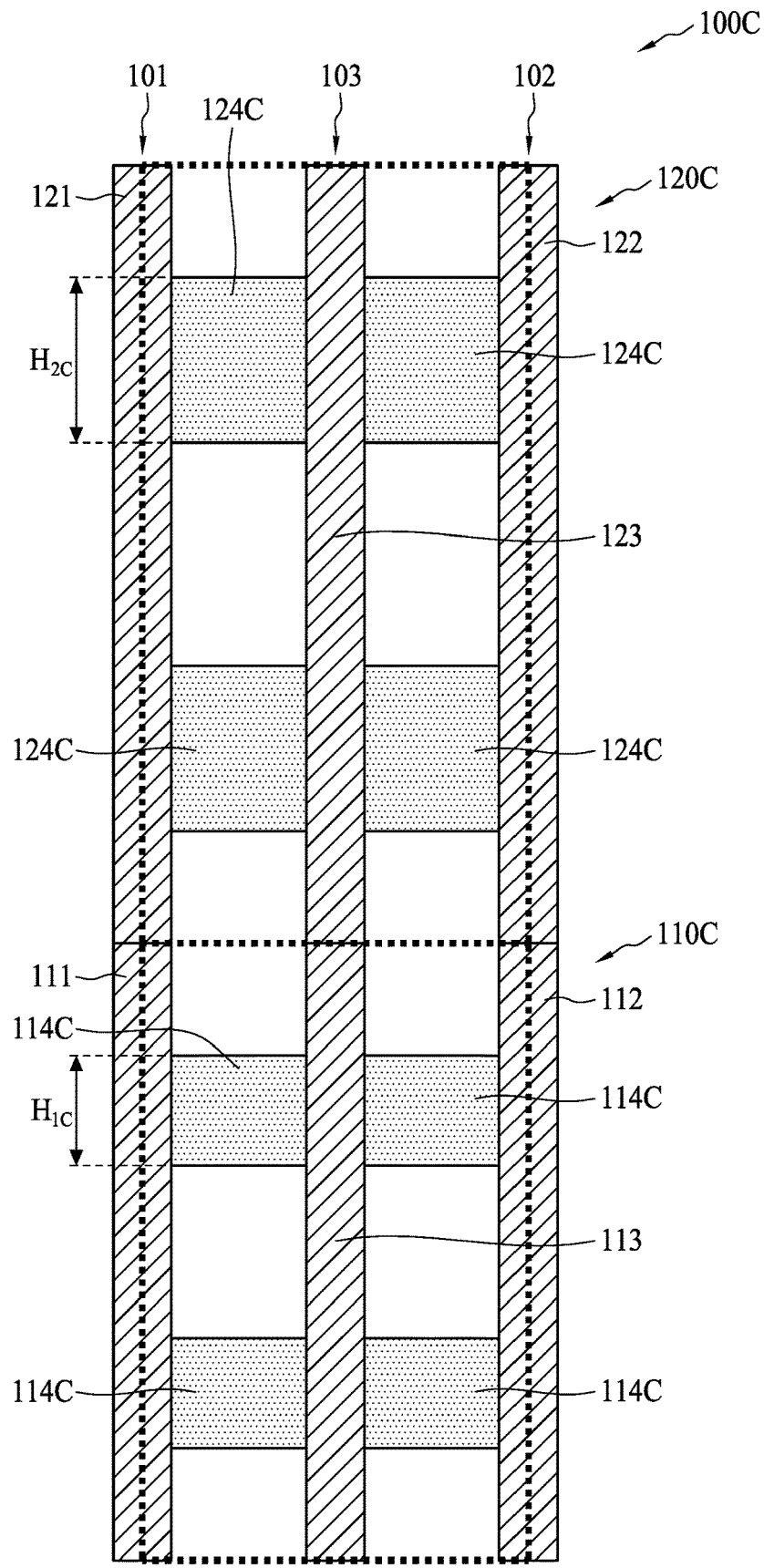
FIG. 1C illustrates a layout view of a semiconductor structure in accordance with another embodiments of the present disclosure.

FIG. 1C illustrates a layout view of a semiconductor structure in accordance with another embodiments of the present disclosure. Referring to FIG. 1C, a semiconductor structure 100C may include a first cell 110C and a second cell 120C. The second cell 120C vertically abuts the first cell 110C. Each first active region 1140 has a first vertical height $H_{1C}$, and each second active region 1240 has a second vertical height $H_{2C}$. The second vertical height $H_{2C}$ is different from the first vertical height $H_{1C}$. In accordance with some embodiments of the present disclosure, the first vertical height $H_{1C}$ is a multiple of fin number, and the second vertical height $H_{2C}$ is a multiple of fin number. For example, the first vertical height $H_{1C}$ is two fin numbers, and the second vertical height $H_{2C}$ is three fin numbers.

Figure 2A:
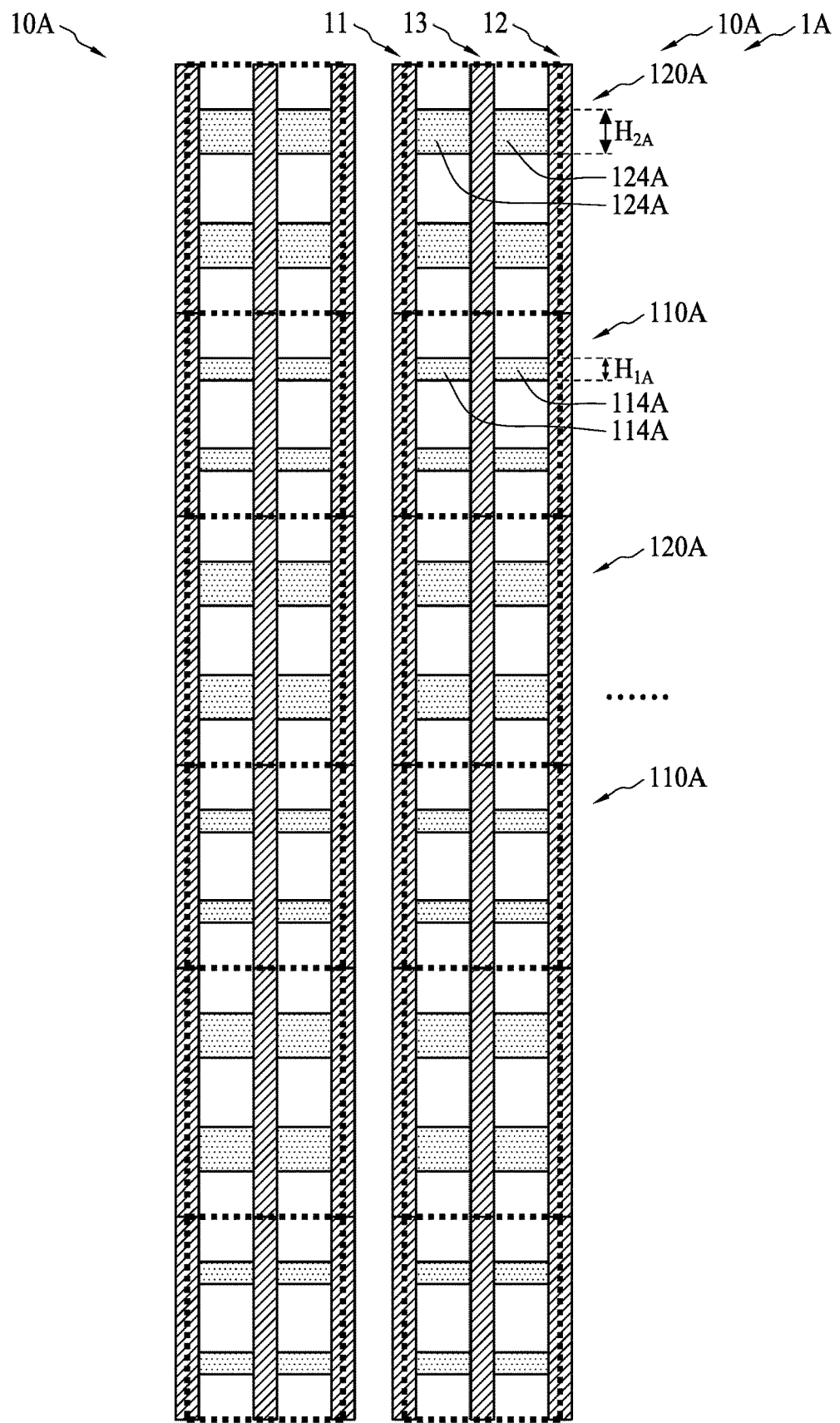
FIG. 2A illustrates a layout view of a semiconductor structure in accordance with some embodiments of the present disclosure.

FIG. 2A illustrates a layout view of a semiconductor structure in accordance with some embodiments of the present disclosure. Referring to FIG. 2A, a semiconductor structure 1A may include a plurality of cell columns 10A. Each cell column 10A has a plurality of first cells 110A and a plurality of second cells 120A, the second cell 120A vertically abuts the first cell 110A. Each cell column 10A includes: a first boundary polysilicon strap 11, a second boundary polysilicon strap 12, a gate polysilicon strap 13, a plurality of first active regions 114A and a plurality of second active regions 124A. The gate polysilicon strap 13 is disposed between the first boundary polysilicon strap 11 and the second boundary polysilicon strap 12, and the gate polysilicon strap 13 is separated from the first boundary polysilicon strap 11 and the second boundary polysilicon strap 12.

The first active regions 114A are disposed in the first cells 110A, and are disposed between the first boundary polysilicon strap 11 and the gate polysilicon strap 13, and are connected to the first boundary polysilicon strap 11 and the gate polysilicon strap 13. In addition, the first active regions 114A are disposed between the second boundary polysilicon strap 12 and the gate polysilicon strap 13, and are connected to the second boundary polysilicon strap 12 and the gate polysilicon strap 13. Each first active region 114A has the first vertical height $H_{1A}$.

The second active regions 124A are disposed in the second cells 120A, and are disposed between the first boundary polysilicon strap 11 and the gate polysilicon strap 13, and are connected to the first boundary polysilicon strap 11 and the gate polysilicon strap 13. In addition, the second active regions 124A are disposed between the second boundary polysilicon strap 12 and the gate polysilicon strap 13, and are connected to the second boundary polysilicon strap 12 and the gate polysilicon strap 13. Each second active region has the second vertical height $H_{2A}$. The second vertical height $H_{2A}$ is different from the first vertical height $H_{1A}$.

In accordance with some embodiments of the present disclosure, the first vertical height $H_{1A}$ is a multiple of fin number, and the second vertical height $H_{2A}$ is a multiple of fin number. For example, the first vertical height is one fin number, and the second vertical height $H_{2A}$ is two fin numbers.

In some embodiments, the cell columns 10A are arranged with the same horizontal level. The first cell 110A and the second cell 120A in the cell column 10A are disposed at the same horizontal level with those in the neighboring cell column 10A. The semiconductor structure 1A has the first cell 110A with the first vertical height $H_{1A}$ and the second cell 120A with the second vertical height $H_{2A}$, the low power design for the first cell 110A and the high power design for the second cell 120A may be obtained in the same semiconductor structure 1A so as to get more flexibility design in chip-level.

Figure 2B:
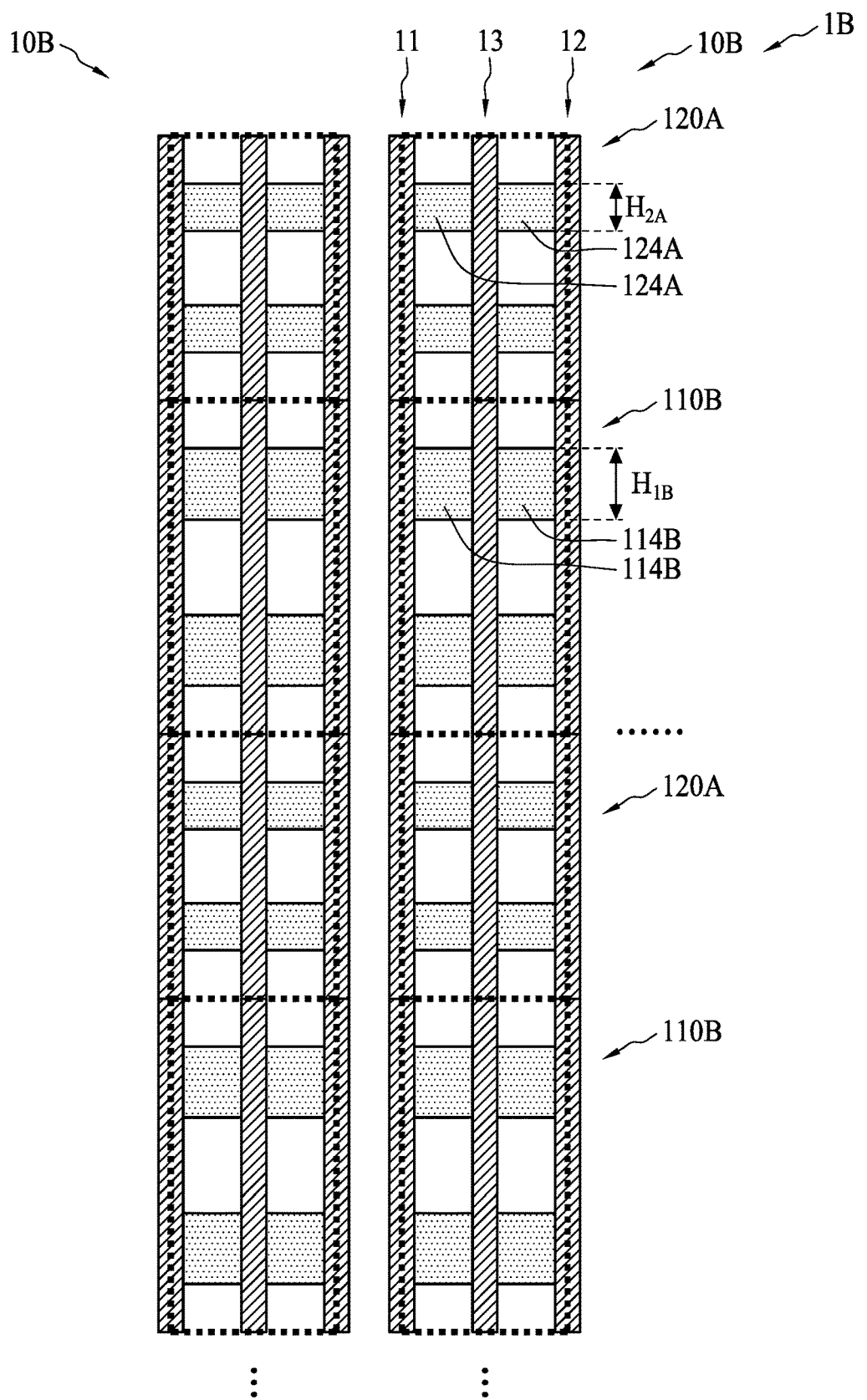
FIG. 2B illustrates a layout view of a semiconductor structure in accordance with another embodiments of the present disclosure.

FIG. 2B illustrates a layout view of a semiconductor structure in accordance with another embodiments of the present disclosure. Referring to FIG. 2B, a semiconductor structure 1B may include a plurality of cell columns 10B. Each cell column 10B has a plurality of first cells 110B and a plurality of second cells 120A, the second cell 120A vertically abuts the first cell 110B. Each first active region 114B has a first vertical height $H_{1B}$, and each second active region 124A has a second vertical height $H_{2A}$. The second vertical height $H_{2A}$ is different from the first vertical height $H_{1B}$. In accordance with some embodiments of the present disclosure, the first vertical height $H_{1B}$ is a multiple of fin number, and the second vertical height $H_{2A}$ is a multiple of fin number. For example, the first vertical height $H_{1B}$ is three fin numbers, and the second vertical height $H_{2A}$ is two fin numbers.

Figure 2C:
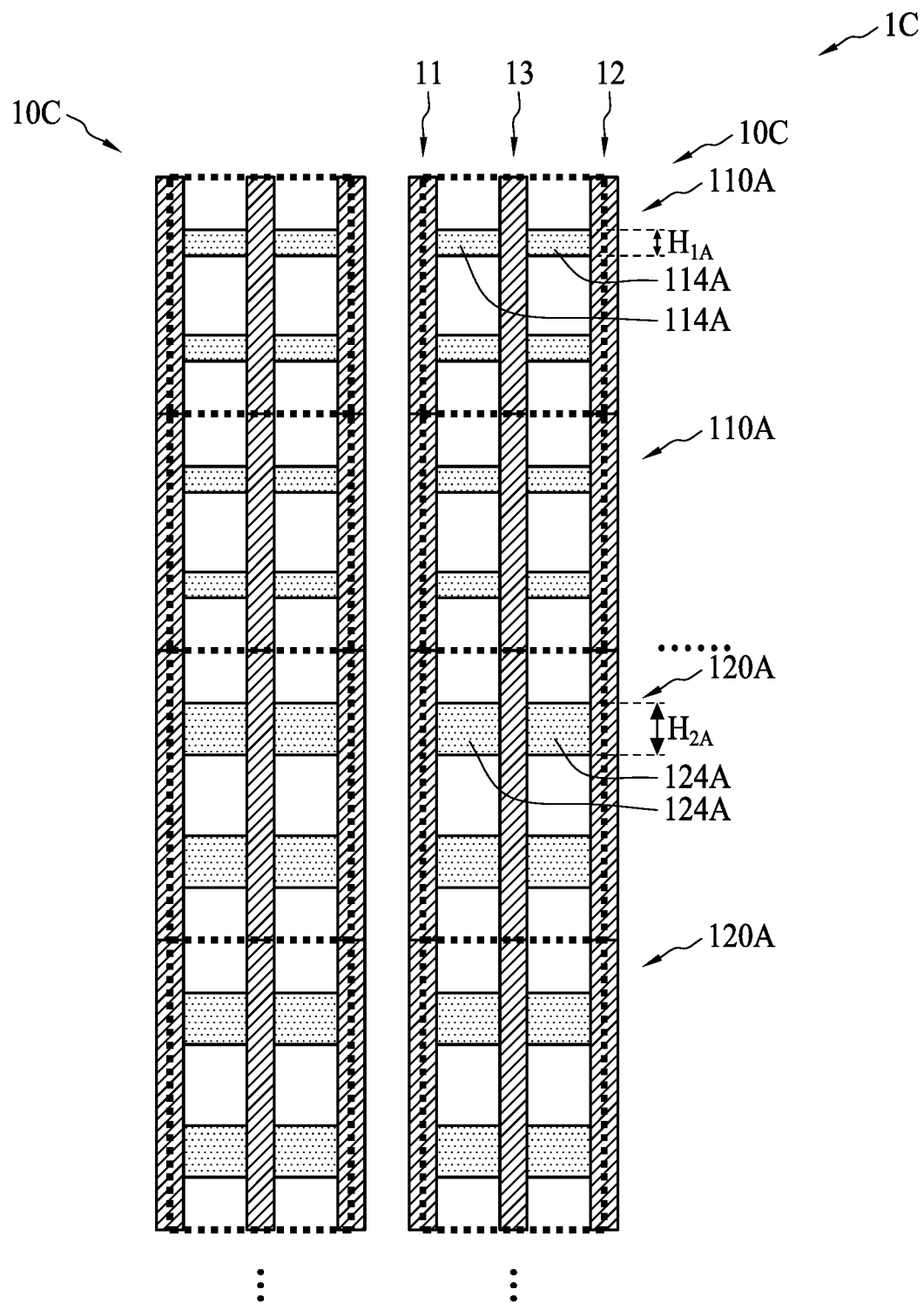
FIG. 2C illustrates a layout view of a semiconductor structure in accordance with another embodiments of the present disclosure.

FIG. 2C illustrates a layout view of a semiconductor structure in accordance with another embodiments of the present disclosure. Referring to FIG. 2C, a semiconductor structure 1C may include a plurality of cell columns 10C. Each cell column 10C has a plurality of first cells 110A and a plurality of second cells 120A, the second cell 120A vertically abuts the first cell 110A. In an embodiment, the two first cells 110A vertically abut, and the two second cells 120A vertically abut. In addition, one of the second cells 120A vertically abuts one of the first cells 110A.

Figure 3A:
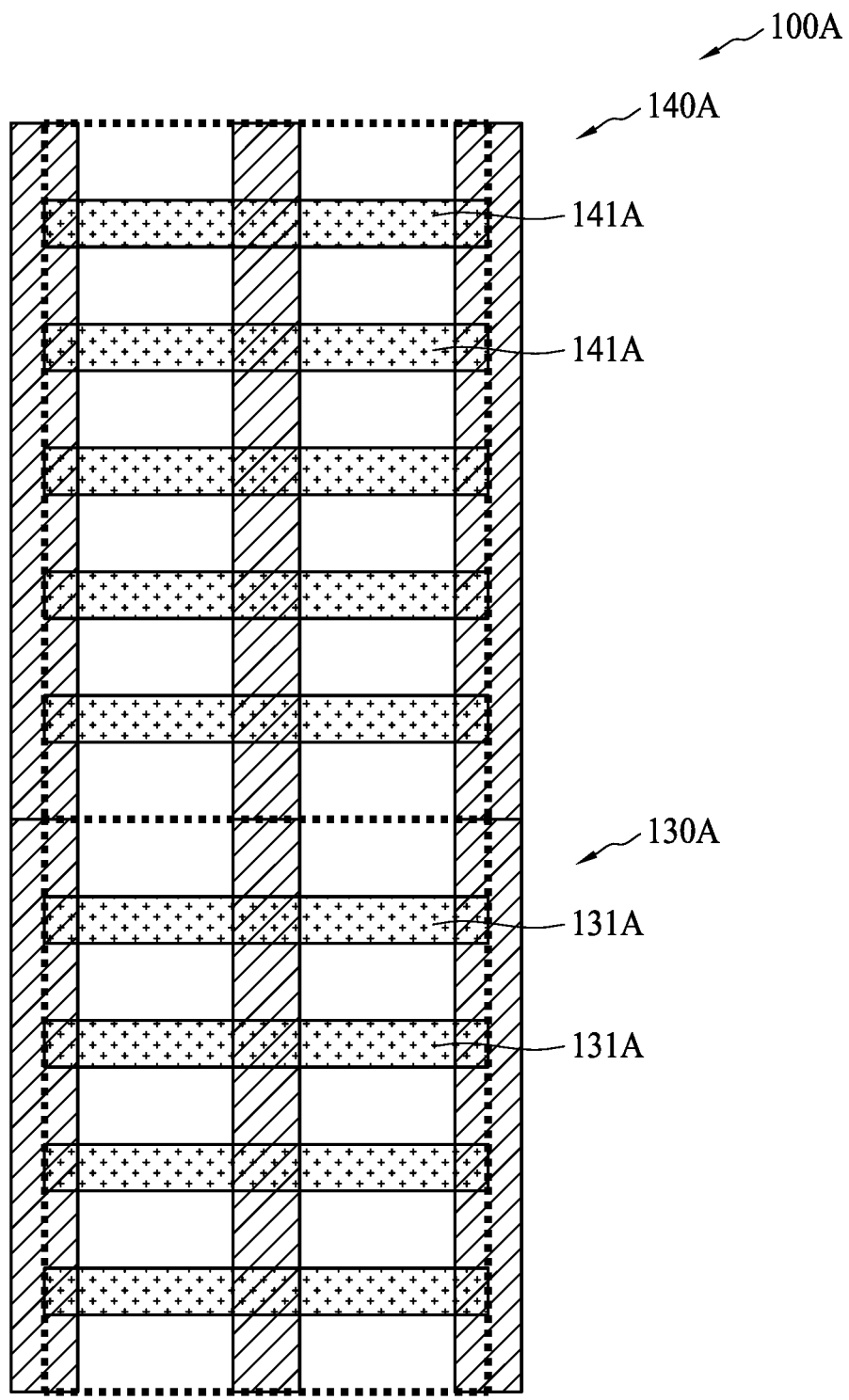
FIG. 3A illustrates a layout view of a semiconductor structure in accordance with some embodiments of the present disclosure.

FIG. 3A illustrates a layout view of a semiconductor structure in accordance with some embodiments of the present disclosure. Referring to FIGS. 1A and 3A, the semiconductor structure 100A may further include a first track cell 130A and a second track cell 140A respectively disposed above the first cell 110A and the second cell 120A. The first track cell 130A has a plurality of first tracks 131A. The number of the first tracks 131A is a first amount, for example the first amount is four. The second track cell 140A has a plurality of second tracks 141A. The number of the second tracks 141A is a second amount, for example the second amount is five. The first amount is different from the second amount.

In an embodiment, the first tracks 131A in the first track cell 130A are parallel to the first active regions 114A, and the second tracks 141A in the second track cell 140A are parallel to the second active regions 124A. The first track cell 130A and the second track cell 140A are disposed on a metal-n layer. For example, the first track cell 130A and the second track cell 140A are disposed on a metal-0 layer, and the first tracks 131A may be electrically connected to the first active regions 114A by vias (not shown in the drawings), and the second tracks 141A may be electrically connected to the second active regions 124A. Since the first amount is different from the second amount, the flexibility for utilizing the vias to connect the tracks and the active regions can be improved.

In some embodiments, the semiconductor structure 100A may include a third track cell (not shown in the drawings) vertically abuts the first track cell 130A or the second track cell 140A. The third track cell has the same structure as the first track cell 130A and the second track cell 140A. The third track cell has a plurality of third tracks. The number of the third tracks is a third amount. The third amount is different from the first amount and the second amount.

Figure 3B:
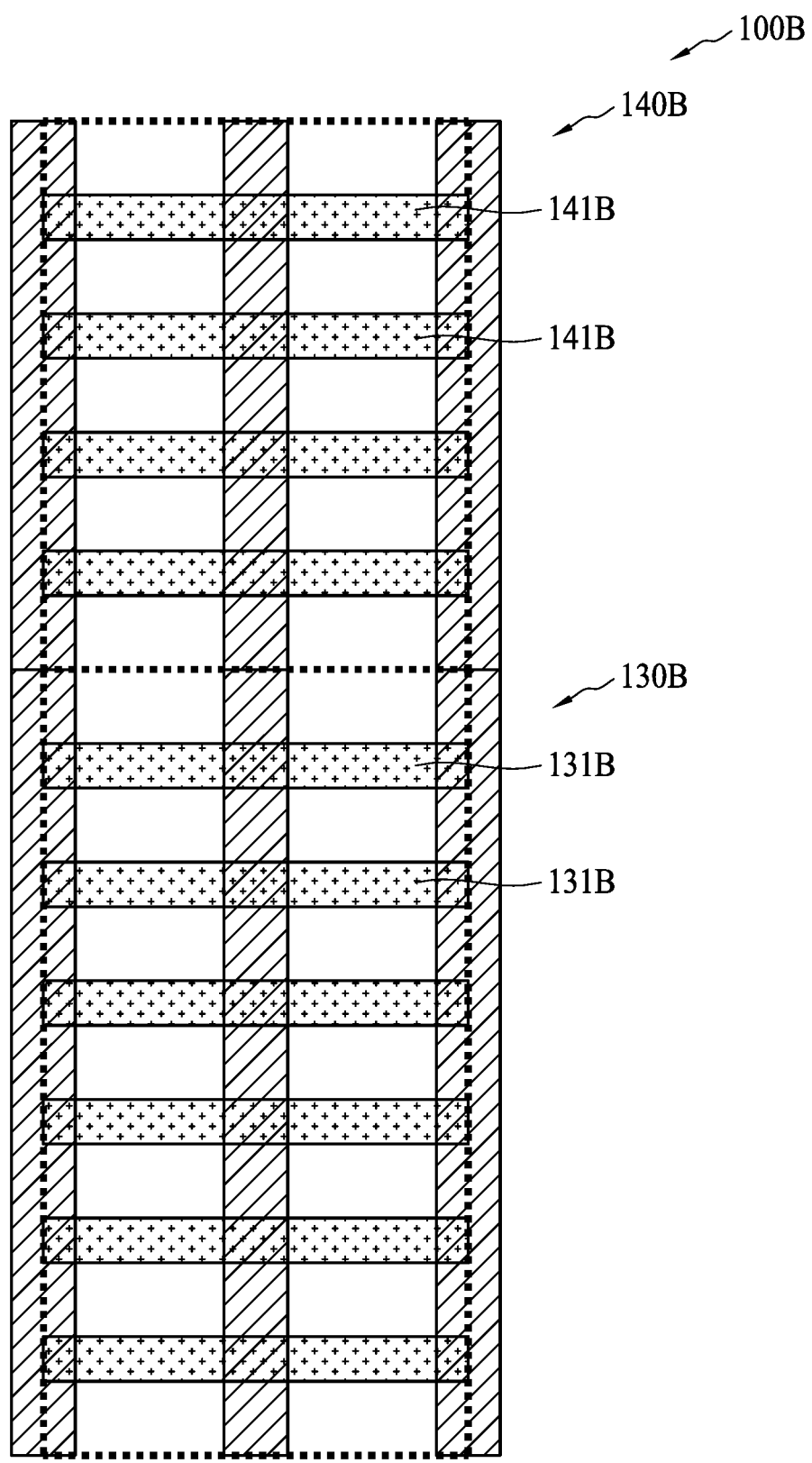
FIG. 3B illustrates a layout view of a semiconductor structure in accordance with another embodiments of the present disclosure.

FIG. 3B illustrates a layout view of a semiconductor structure in accordance with another embodiments of the present disclosure. Referring to FIGS. 1B and 3B, the semiconductor structure 100B may further include a first track cell 130B and a second track cell 140B respectively disposed above the first cell 110B and the second cell 120B. The first track cell 130B has a plurality of first tracks 131B. The number of the first tracks 131B is a first amount, for example the first amount is six. The second track cell 140B has a plurality of second tracks 141B. The number of the second tracks 141B is a second amount, for example the second amount is four. The first amount is different from the second amount.

Figure 3C:
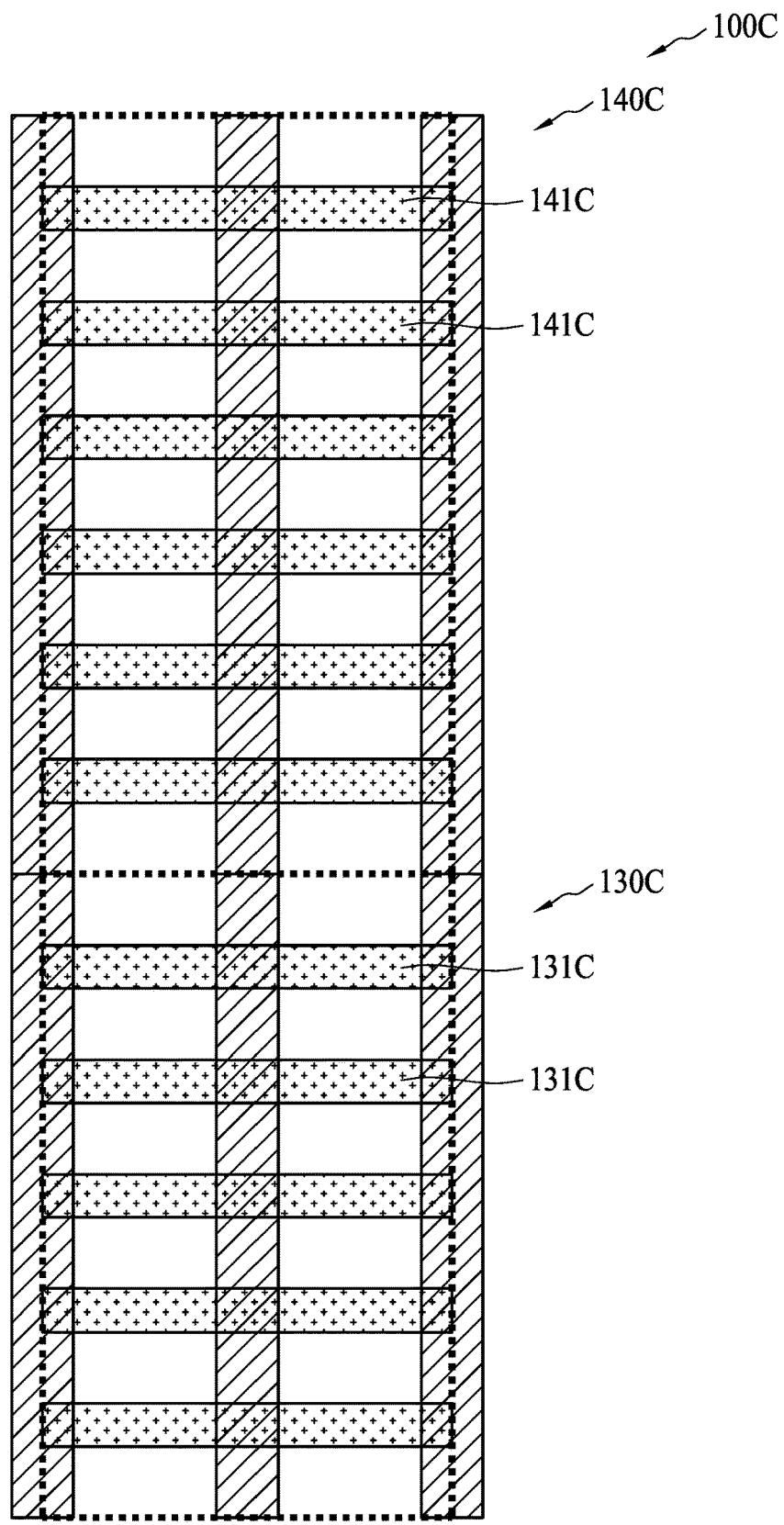
FIG. 3C illustrates a layout view of a semiconductor structure in accordance with another embodiments of the present disclosure.

FIG. 3C illustrates a layout view of a semiconductor structure in accordance with another embodiments of the present disclosure. Referring to FIGS. 1C and 3C, the semiconductor structure 100C may further include a first track cell 130C and a second track cell 140C respectively disposed above the first cell 110C and the second cell 120C. The first track cell 130C has a plurality of first tracks 131C. The number of the first tracks 131C is a first amount, for example the first amount is five. The second track cell 140C has a plurality of second tracks 141C. The number of the second tracks 141C is a second amount, for example the second amount is six. The first amount is different from the second amount.

Figure 4:
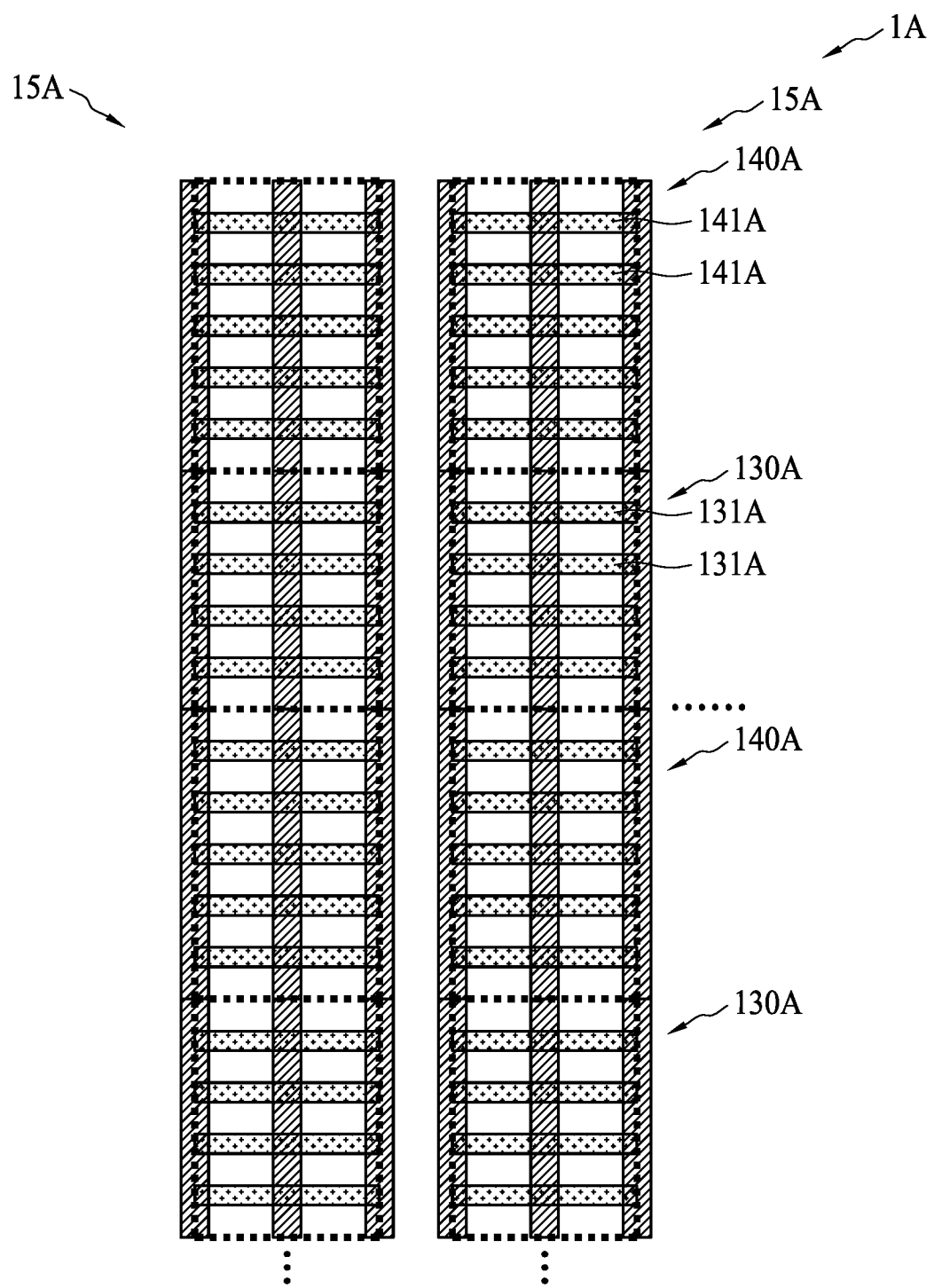
FIG. 4 illustrates a layout view of a semiconductor structure in accordance with some embodiments of the present disclosure.

FIG. 4 illustrates a layout view of a semiconductor structure in accordance with some embodiments of the present disclosure. Referring to FIGS. 2A and 4, the semiconductor structure 1A may further include a plurality of track columns 15A. The track columns 15A are disposed above the cell columns 10A. Each track column 15A has a plurality of first track cells 130A and a plurality of second track cells 140A. The first track cells 130A are disposed above the first cells 110A, and the second track cells 140A are disposed above the second cells 120A. The first track cell 130A has a plurality of first tracks 131A. The number of the first tracks 131A is four. The second track cell 140A has a plurality of second tracks 141A. The number of the second tracks 141A is five. The number of the first tracks 131A is different from that of the second tracks 141A.

In some embodiments, the track columns 15A are arranged with the same horizontal level. The first track cell 130A and the second track cell 140A in the track column 15A are disposed at the same horizontal level with those in the neighboring cell column 15A, Since the first amount is different from the second amount, the flexibility for utilizing, the vias to connect the tracks and the active regions can be improved.

Figure 5:
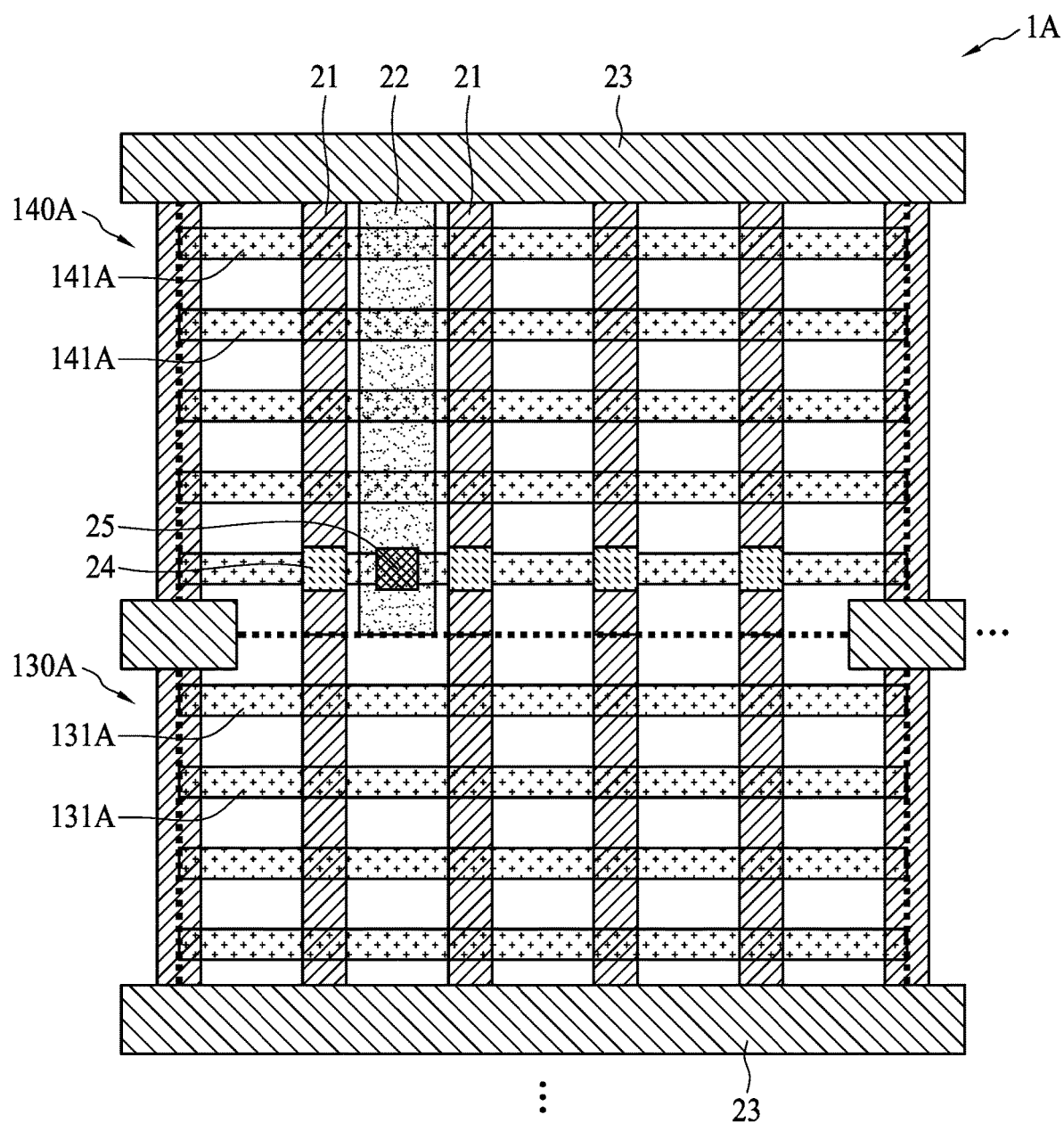
FIG. 5 illustrates a layout view of a semiconductor structure in accordance with some embodiments of the present disclosure.

FIG. 5 illustrates a layout view of a semiconductor structure in accordance with some embodiments of the present disclosure. Referring to FIGS. 3A and 5, the semiconductor structure 1A may further include a plurality of connecting polysilicon sections 21, at least one metal line 22 and a plurality of cutting polysilicon sections 23. The connecting polysilicon sections 21, the metal line 22 and the cutting polysilicon sections 23 are disposed on a metal-n+1 layer, for example, the connecting polysilicon sections 21, the metal line 22 and the cutting polysilicon sections 23 are disposed on a metal-1 layer. The metal-n+1 layer is disposed above the metal-n layer, for example, the metal-1 layer is disposed above the metal-0 layer. The connecting polysilicon sections 21 may be electrically connected to the tracks 141A by vias-gate 24, and the metal line 22 may be electrically connected to the tracks by vias-n+1 25. The cutting polysilicon sections 23 are used to cut the connecting polysilicon sections 21, and are disposed at the two ends of the connecting polysilicon sections 21.

In an embodiment, the metal line 22 is used to electrically con CC to the other elements. In addition, the connecting polysilicon sections 21 extend cross above the first track cell 130A and the second track cell 140A, and there is no the cutting polysilicon section between the first track cell 130A and the second track cell 140A. Thus the length of the metal line 22 is about a half of the connecting polysilicon section 21. Using the configurations, the process for manufacturing the semiconductor structure of the present disclosure is easier, and the cost of material will be reduced. Furthermore, removing the cutting polysilicon section between the first track cell 130A and the second track cell 140A, there is no need to use vias-gate 24 to connect the connecting polysilicon sections 21 and the first tracks 131A. Therefore, on the metal-n+1 layer, the metal resistance and capacitance can be reduced.

Figure 6:
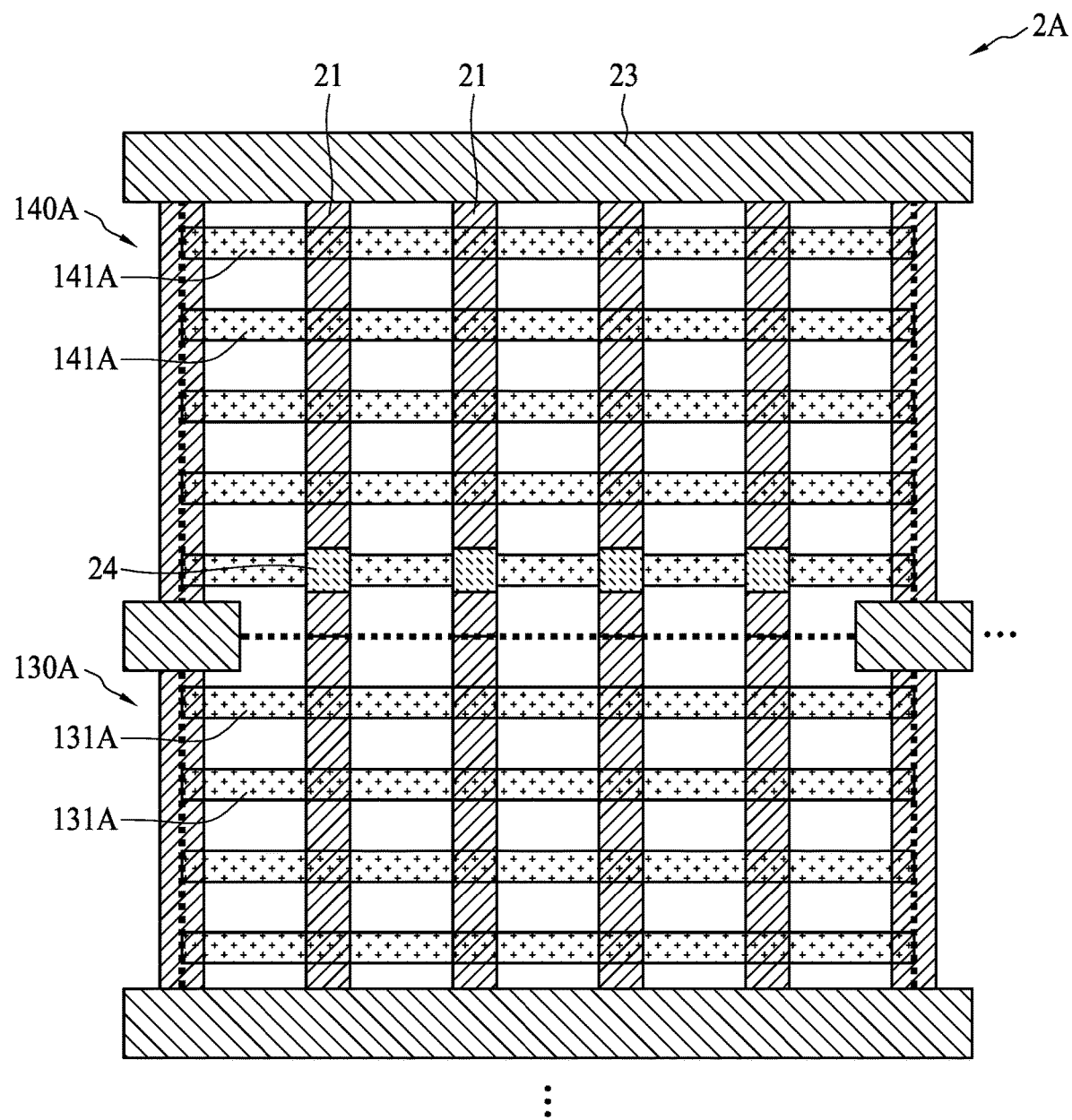
FIG. 6 illustrates a layout view of a semiconductor structure in accordance with some embodiments of the present disclosure.

FIG. 6 illustrates a layout view of a semiconductor structure in accordance with some embodiments of the present disclosure. Referring to FIGS. 5 and 6, the semiconductor structure 2A shown in FIG. 6 is similar to the semiconductor structure 1A shown in FIG. 5, and the differences are described as follows. In an embodiment, the semiconductor structure 2A is used to be an input pin or output pin, and there is no need to use the metal line 22 in FIG. 5 to connect to the other elements. Therefore, the metal resistance and capacitance can be further reduced, and the performance of the semiconductor structure 2A can be improved.

In some embodiments, a semiconductor structure is disclosed, including: a first cell and a second cell. The second cell vertically abuts the first cell. The first cell includes a first boundary polysilicon section, a second boundary polysilicon section, a first gate polysilicon section and a plurality of first active regions. The first gate polysilicon section is disposed between the first boundary polysilicon section and the second boundary polysilicon section, and the first gate polysilicon section is separated from the first boundary polysilicon section and the second boundary polysilicon section. The first active regions are disposed between the first boundary polysilicon section and the first gate polysilicon section, and are connected to the first boundary polysilicon section and the first gate polysilicon section. The first active regions are disposed between the second boundary polysilicon section and the first gate polysilicon section, and are connected to the second boundary polysilicon section and the first gate polysilicon section. Each first active region has a first vertical height. The second cell includes a third boundary polysilicon section, a fourth boundary polysilicon section, a second gate polysilicon section and a plurality of second active regions. The second gate polysilicon section is disposed between the third boundary polysilicon section and the fourth boundary polysilicon section, and the second gate polysilicon section is separated from the third boundary polysilicon section and the fourth boundary polysilicon section. The second active regions are disposed between the third boundary polysilicon section and the second gate polysilicon section, and are connected to the third boundary polysilicon section and the second gate polysilicon section. The second active regions are disposed between the fourth boundary polysilicon section and the second gate polysilicon section, and are connected to the fourth boundary polysilicon section and the second gate polysilicon section. Each second active region has a second vertical height. The second vertical height is different from the first vertical height.

In some embodiments, a semiconductor structure is disclosed, including: a first boundary polysilicon strap, a second boundary polysilicon strap, a gate polysilicon strap, a plurality of first active regions and a plurality of second active regions. The gate polysilicon strap is disposed between the first boundary polysilicon strap and the second boundary polysilicon strap, and the gate polysilicon strap is separated from the first boundary polysilicon strap and the second boundary polysilicon strap. The first active regions are disposed in the first cells, and are disposed between the first boundary polysilicon strap and the gate polysilicon strap, and are connected to the first boundary polysilicon strap and the gate polysilicon strap. The first active regions are disposed between the second boundary polysilicon strap and the gate polysilicon strap, and are connected to the second boundary polysilicon strap and the gate polysilicon strap. Each first active region has a first vertical height. The second active regions are disposed in the second cells, and are disposed between the first boundary polysilicon strap and the gate polysilicon strap, and are connected to the first boundary polysilicon strap and the gate polysilicon strap. The second active regions are disposed between the second boundary polysilicon strap and the gate polysilicon strap, and are connected to the second boundary polysilicon strap and the gate polysilicon strap. Each second active region has a second vertical height. The second vertical height is different from the first vertical height.

In some embodiments, a semiconductor structure is disclosed, including: an active layer, a metal-n layer and a metal-n+1 layer. The active layer has a plurality of first cells and a plurality of second cells. The second cell vertically abuts the first cell. Each first cell has a plurality of first active regions. Each first active region has a first vertical height. Each second cell has a plurality of second active regions. Each second active region has a second vertical height. The second vertical height is different from the first vertical height. The metal-n layer is disposed above the active layer. The metal-n layer has a plurality of first track cells and a plurality of second track cells respectively disposed above the first cells and the second cells. The first track cell has a first amount of first tracks, and the second track cell has a second amount of second tracks. The first amount is different from the second amount. The metal-n+1 layer is disposed above the metal-n layer. The metal-n+1 layer has a plurality of connecting polysilicon sections and a plurality of cutting polysilicon sections. The connecting polysilicon sections are electrically connected to the first tracks or the second tracks. The cutting polysilicon sections are used for cutting the connecting polysilicon sections.

What is claimed is:

1. A semiconductor structure, comprising:
   a first cell having a first cell height, the first cell comprising:
   a first boundary polysilicon section and a second boundary polysilicon section;
   a first gate polysilicon section disposed between the first boundary polysilicon section and the second boundary polysilicon section, and the first gate polysilicon section separated from the first boundary polysilicon section and the second boundary polysilicon section; and
   a plurality of first active regions separated from each other, the plurality of first active regions disposed between and connected to the first boundary polysilicon section and the first gate polysilicon section, the plurality of first active regions disposed between and connected to the second boundary polysilicon section and the first gate polysilicon section, each of the plurality of first active regions having a first vertical height;
   a second cell vertically abutting the first cell and having a second cell height different from the first cell height, the second cell comprising:
   a third boundary polysilicon section and a fourth boundary polysilicon section;
   a second gate polysilicon section disposed between the third boundary polysilicon section and the fourth boundary polysilicon section, and the second gate polysilicon section separated from the third boundary polysilicon section and the fourth boundary polysilicon section; and
   a plurality of second active regions separated from each other, the plurality of second active regions disposed between and connected to the third boundary polysilicon section and the second gate polysilicon section, the plurality of second active regions disposed between and connected to the fourth boundary polysilicon section and the second gate polysilicon section, each of the plurality of second active regions having a second vertical height;
   a first track cell disposed above the first cell, the first track cell having a first amount of first tracks; and
   a second track cell disposed above the second cell, the second track cell having a second amount of first tracks, wherein the first amount is different from the second amount,
   wherein the second vertical height is different from the first vertical height, wherein the first boundary polysilicon section is connected to the third boundary polysilicon section to form a first boundary polysilicon segment extending from the first cell to the second cell, the second polysilicon section is connected to the fourth boundary polysilicon section to form a second boundary polysilicon segment extending from the first cell to the second cell, and the first gate polysilicon section is connected to the second gate polysilicon section to form a gate polysilicon segment extending from the first cell to the second cell.

2. The semiconductor structure of claim 1, further comprising a third cell vertically abutting the first cell or the second cell, a third active region of the third cell having a third vertical height, and the third vertical height being different from the first vertical height and the second vertical height.

3. The semiconductor structure of claim 1, wherein the first tracks in the first track cell and the second tracks in the second track cell are parallel to the first active regions and the second active regions, the first track cell and the second track cell are disposed on a metal-n layer.

4. The semiconductor structure of claim 3, further comprising a third track cell vertically abuts the first track cell or the second track cell, the third track cell having a third amount of third tracks, the third amount is different from the first amount and the second amount.

5. The semiconductor structure of claim 1, wherein the first cell and the second cell are formed as a cell group.

6. The semiconductor structure of claim 1, wherein a ratio of the first vertical height and the second vertical height is 3:1.

7. The semiconductor structure of claim 6, wherein a ratio of the first amount and the second amount is 3:2.

8. The semiconductor structure of claim 6, wherein the first amount is six and the second amount is four.

9. The semiconductor structure of claim 1, wherein a ratio of the first vertical height and the second vertical height is 2:3.

10. The semiconductor structure of claim 9, wherein a ratio of the first amount and the second amount is 5:6.

11. A semiconductor structure, comprising:
a plurality of cell columns, each cell column having a plurality of first cells and a plurality of second cells, the second cell vertically abutting the first cell, wherein each of the plurality of first cells has a first cell height and each of the plurality of second cells has a second cell height different from the first cell height, each cell column comprising:
a first boundary polysilicon segment and a second boundary polysilicon segment extending along a first direction through the plurality of first cells and the plurality of second cells;
a gate polysilicon segment disposed between the first boundary polysilicon segment and the second boundary polysilicon segment, and the gate polysilicon segment separated from the first boundary polysilicon segment and the second boundary polysilicon segment, wherein the gate polysilicon segment along the first direction extends through the plurality of first cells and the plurality of second cells;
a plurality of first active regions disposed in the first cells and separated from each other, the plurality of first active regions disposed between and connected to the first boundary polysilicon segment and the gate polysilicon segment, and disposed between and connected to the second boundary polysilicon segment and the gate polysilicon segment, each first active region having a first vertical height; and
a plurality of second active regions disposed in the second cells and separated from each other, the plurality of second active regions disposed between and connected to the first boundary polysilicon segment and the gate polysilicon segment, and disposed between and connected to the second boundary polysilicon segment and the gate polysilicon segment, each second active region having a second vertical height different from the first vertical height; and
a plurality of track columns disposed above the cell columns, wherein each track column comprises a plurality of first track cells and a plurality of second track cells, wherein the first track cells are disposed above the first cells, and the second track cells are disposed above the second cells, wherein the first track cell has a plurality of first tracks, and the second track cell has a plurality of second tracks, and wherein a ratio of the number of the first tracks and the number of the second tracks is 4:5.

12. The semiconductor structure of claim 11, wherein the first cells vertically abut, and the second cells vertically abut, one of the second cells vertically abuts one of the first cells.

13. The semiconductor structure of claim 11, wherein the cell columns are aligned in a second direction substantially perpendicular to the first direction.

14. The semiconductor structure of claim 11, wherein the track columns are disposed on a metal-n layer.

15. The semiconductor structure of claim 11, wherein the track columns are aligned in a second direction substantially perpendicular to the first direction.

16. The semiconductor structure of claim 11, wherein the first vertical height is half of the second vertical height.

17. A semiconductor structure, comprising:
an active layer, having a plurality of first cells and a plurality of second cells, the second cell vertically abutting the first cell, each first cell having a first cell height and each second cell having a second cell height different from the first cell height, each first cell having a plurality of first active regions separated from each other, each first active region having a first vertical height; each second cell having a plurality of second active regions separated from each other, each second active region having a second vertical height, the second vertical height being twice the first vertical height;
a metal-n layer, disposed above the active layer, the metal-n layer having a plurality of first track cells and a plurality of second track cells respectively disposed above the first cells and the second cells, the first track cell having a first amount of first tracks, and the second track cell having a second amount of second tracks, the first amount being different from the second amount; and
a plurality of connecting polysilicon sections disposed above the active layer, the connecting polysilicon sections electrically connected to the first tracks or the second tracks, wherein the plurality of connection polysilicon sections extend through the plurality of first cells and the plurality of second cells.

18. The semiconductor structure of claim 17, wherein a ratio of the first amount and the second amount is 4:5.

19. The semiconductor structure of claim 17, further comprising a metal line electrically connected to the first tracks or the second tracks.

20. The semiconductor structure of claim 19, wherein at least one of the connecting polysilicon sections is electrically connected to the first tracks or the second tracks by a via.

* * * * *